United States Patent
Heidinger et al.

(10) Patent No.: US 10,311,170 B2
(45) Date of Patent: Jun. 4, 2019

(54) SYSTEM FOR PROVIDING INFRASTRUCTURE IMPACTS ON AN URBAN AREA

(71) Applicants: Klaus Heidinger, Hinterbrühl (AT); Pedro Miranda, München (DE); Katrin Müller, Berlin (DE); Willfried Wienholt, London (GB)

(72) Inventors: Klaus Heidinger, Hinterbrühl (AT); Pedro Miranda, München (DE); Katrin Müller, Berlin (DE); Willfried Wienholt, London (GB)

(73) Assignee: Siemens Aktiengesellschaft, Munich (DE)

( * ) Notice: Subject to any disclaimer, the term of this patent is extended or adjusted under 35 U.S.C. 154(b) by 932 days.

(21) Appl. No.: 14/051,256

(22) Filed: Oct. 10, 2013

(65) Prior Publication Data
US 2015/0100285 A1    Apr. 9, 2015

Related U.S. Application Data

(63) Continuation of application No. PCT/EP2013/071015, filed on Oct. 9, 2013.

(51) Int. Cl.
*G06F 17/50* (2006.01)
*G06Q 10/06* (2012.01)

(52) U.S. Cl.
CPC ... *G06F 17/5009* (2013.01); *G06Q 10/06375* (2013.01)

(58) Field of Classification Search
CPC ........................ G06F 17/5009; G06Q 10/06375
USPC .............................................................. 703/2
See application file for complete search history.

(56) References Cited

U.S. PATENT DOCUMENTS 5,615,347 A * 3/1997 Davis .................. G06F 3/04847
715/804

OTHER PUBLICATIONS

Kousa et al. "A model for evaluating the population exposure to ambient airpollution in an urban area" Atmospheric Environment 36 (2002) 2109-2119 Feb. 27, 2002.*
"Notice from the European Patent Office dated Oct. 1, 2007, concerning business methods", Journal of the European Patent Office, vol. 30, No. 11, pp. 592-593, Nov. 1, 2007.
International Search Report and Written Opinion in PCT/EP2013/071015, dated Apr. 28, 2014, 13 pages.

* cited by examiner

*Primary Examiner* — Saif A Alhija
(74) *Attorney, Agent, or Firm* — Lempia Summerfield Katz LLC

(57) ABSTRACT

A system for providing infrastructure impacts on an urban area is provided. Area specific content data of a selected urban area is loaded from a database, and infrastructure impacts on the selected urban area are calculated by a calculation unit depending on the loaded area specific content data and technology parameters of predefined infrastructure levers set by a user.

18 Claims, 12 Drawing Sheets

Without ATO
Time-optimal train run

With ATO
Long distance between stations

With ATO
Short distance between stations

SYSTEM FOR PROVIDING INFRASTRUCTURE IMPACTS ON AN URBAN AREA

This application is a continuation application of PCT/EP2013/071015, filed on Oct. 9, 2013, which is hereby incorporated by reference in its entirety.

BACKGROUND

More than half the world's population lives in urban areas. A mega city is a metropolitan area with a total population in excess of ten million people. Urban or metropolitan areas have to cope with major challenges such as traffic congestion or environmental problems including air pollution. Air pollution is the introduction of chemicals, particulate matter or biological materials that cause harm or discomfort to humans or other living organisms into the atmosphere. The urban areas have significant problems with smog (e.g., a type of air pollution derived from vehicle emissions from combustion engines and industrial fumes that react in the atmosphere with sunlight to form secondary pollutants that also combine with the primary emissions to form photochemical smog). Smog may be caused by large amounts of coal burning that create a mixture of smoke and sulfur dioxide.

An urban area or city is a complex system including a plurality of infrastructure elements. Infrastructure is a technical structure that includes, for example, roads, bridges, water supply, electrical grids, and telecommunication facilities. The essential infrastructure categories are building and transport facilities of the city. Hard infrastructure and soft infrastructure may be distinguished between. Hard infrastructure refers to physical entities provided for the function of urban areas, where soft infrastructure may refer to institutions that are provided to maintain economic, health and cultural standards such as, for example, the financial system and education system or health care system. Infrastructures of an urban area include mostly transport infrastructure, energy infrastructure, communication infrastructure and waste management infrastructure. Hard infrastructure entities may serve the function of conveyance or channelling of people, vehicles, fluids, energy or information data. These infrastructure entities may include networks for transporting or channelling objects in the urban area. Infrastructure systems of the urban area include infrastructure elements and/or infrastructure networks and the control systems and the software used to operate, manage and monitor these infrastructure systems, as well as any accessory buildings, plants or vehicles that form an integral part of the infrastructure system. This includes fleets of vehicles operating according to a schedule such as public transport busses or garbage collection vehicles. Further infrastructure systems of an urban area may also include energy or communication facilities that are not usually part of a physical network such as radio and television broadcasting facilities or oil refineries.

The choice of infrastructure measures or infrastructure entities does have a major impact on the urban area. These impacts include technical impacts as well as economic impacts. Important technical impacts of the infrastructure of a city are the environmental effects caused by the infrastructure entities such as greenhouse gas emissions or particulate matter (PM) emissions in the urban area. When planning the infrastructure of an urban area, the involved infrastructure impacts are to be considered. For the very early phase of the planning, there are no sufficient methods available. Possible infrastructure impacts of planned infrastructure entities are only estimated, and any calculations are done mainly singularly on the basis of generic data or reference projects. These kinds of calculations are very time-consuming and cumbersome and lead to very poor results because the calculations are unsystematic. Accordingly, there is a need for a system and method for providing infrastructure impacts on an urban area that overcome the above-mentioned drawbacks.

SUMMARY AND DESCRIPTION

The scope of the present invention is defined solely by the appended claims and is not affected to any degree by the statements within this summary.

In one embodiment, a system for providing infrastructure impacts on an urban area is provided. Area specific content data of a selected urban area is loaded from a database, and infrastructure impacts on the selected urban area are calculated by a calculation unit depending on the loaded area specific content data and technology parameters of predefined infrastructure levers set by a user.

In an embodiment of the system, different infrastructure impact scenarios are precalculated by a calculation unit of a backend system and stored in a content management database of a content management system.

In one embodiment of a system, terminal devices of registered users have access to the content management system to receive the precalculated infrastructure impact scenarios for the predefined infrastructure levers.

The terminal device is in an embodiment a mobile device such as a laptop or an iPad.

In one embodiment of the system, the predefined infrastructure levers for infrastructure elements are displayed on a display of a terminal device to be set by the user along with corresponding assigned implementation rates of the respective infrastructure levers.

In a further embodiment of the system, the area specific content data of the selected urban area includes a hierarchical area data model of the urban area for at least one point in time including interlinked processes of infrastructure elements. At least some processes of the hierarchical area data model interact with predefined infrastructure levers.

In a further embodiment of the system, an absolute or relative implementation rate of the infrastructure lever is assigned by the user to each infrastructure lever set by the user.

In another embodiment of the system, basic processes of the hierarchical area data model at a lowest hierarchical level are adapted to calculate an infrastructure impact of a resource consumption of an infrastructure element of a process to which the respective basic process is linked in the hierarchical area data model.

In one embodiment of the system, key performance indicators are calculated indicating the infrastructure impact of the predefined infrastructure levers set by the user on the selected urban area.

In another embodiment of the system, the infrastructure impacts provided by the system include environmental impacts and/or economic impacts on the selected urban area.

In a further embodiment of the system, the environmental impacts include greenhouse gas emissions, NOX emissions and/or particulate matter emissions in the selected urban area.

In a further embodiment of the system, the infrastructure elements of the hierarchical area data model of the selected urban area include building infrastructure elements, transport infrastructure elements and/or energy infrastructure elements of the selected urban area.

In a further embodiment of the system, the infrastructure levers include efficiency levers representing technical improvements of an implemented technology of existing infrastructure elements, shift levers representing a shift from an infrastructure element implemented in a first technology to an infrastructure element implemented in a second technology, demand levers representing changes in demand for infrastructure elements in the urban area, and any combination of efficiency improvement, shifting the infrastructure element and demand reduction. One or more of the present embodiments further provide a method for providing infrastructure impacts on an urban area. In the method, area specific content data of a selected urban area is loaded from a database, and infrastructure impacts on the selected urban area are calculated by a calculation unit depending on the loaded area specific content data and technology parameters of predefined infrastructure levers set by a user.

According to one embodiment, an urban planning software tool is provided. The software tool is adapted to simulate infrastructure impacts on an urban area. Area specific content data of a selected urban area is loaded from a database, and infrastructure impacts on the selected urban area are calculated by a calculation unit depending on the loaded area specific content data and technology parameters of predefined infrastructure levers set by a user.

In one embodiment of the urban planning software tool, the software tool is adapted to calculate key performance indicators indicating infrastructure impacts of the predefined infrastructure levers set by the user on the selected urban area.

BRIEF DESCRIPTION OF THE DRAWINGS

FIG. 15 shows a further screenshot of one embodiment of an urban planning software tool to illustrate a possible output to a user.

DETAILED DESCRIPTION

Figure 1:
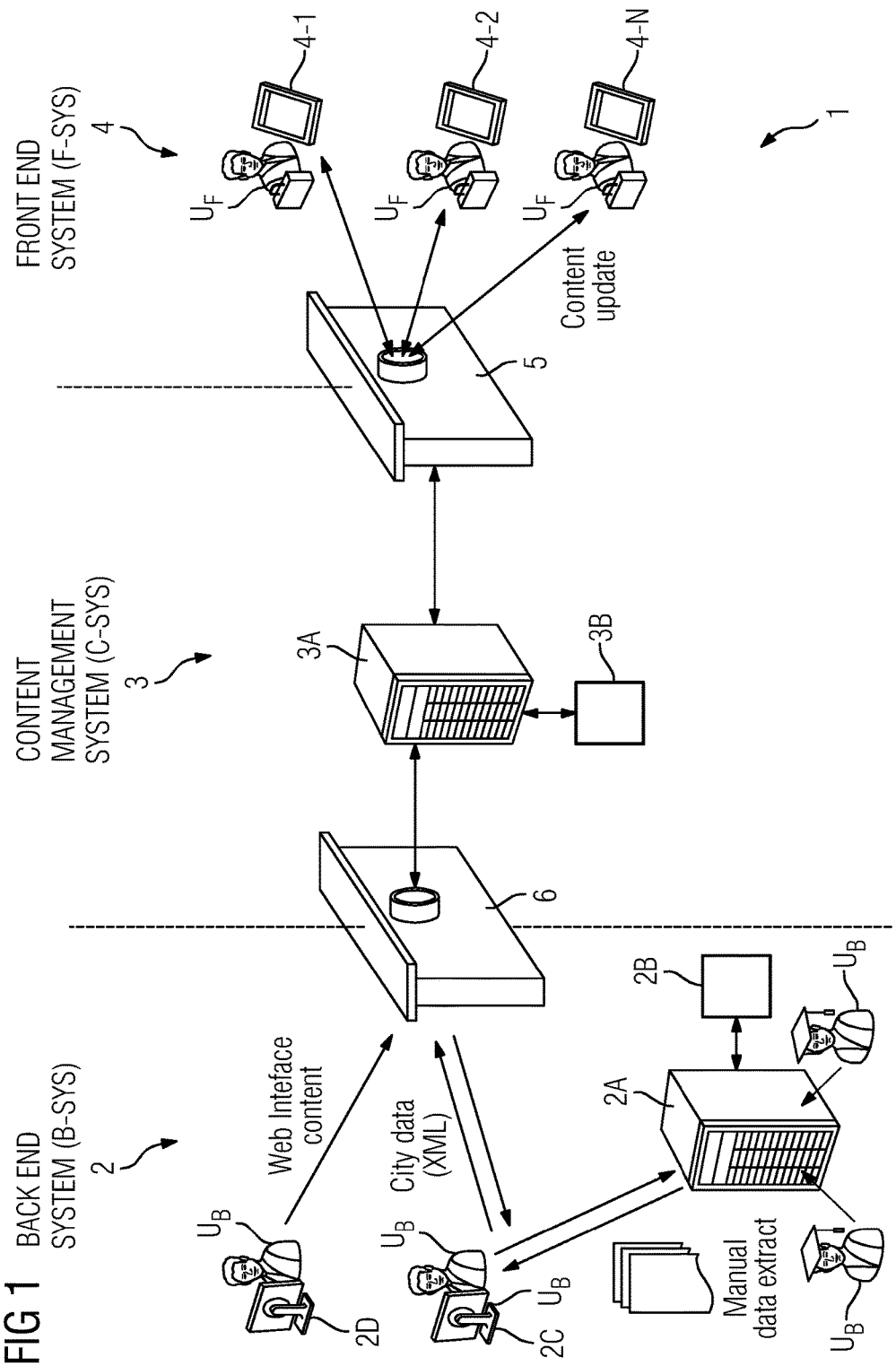
FIG. 1 shows one embodiment of a system for providing infrastructure impacts on an urban area.

FIG. 1 shows a diagram illustrating one embodiment of a system 1 for providing infrastructure impacts on an urban area. In the shown exemplary embodiment, the system 1 includes a backend system 2, a content management system 3 and a frontendo system 4. In the shown exemplary embodiment of FIG. 1, the frontend system 4 is separated from the content management system 3 by a first firewall 5.

Figure 2:
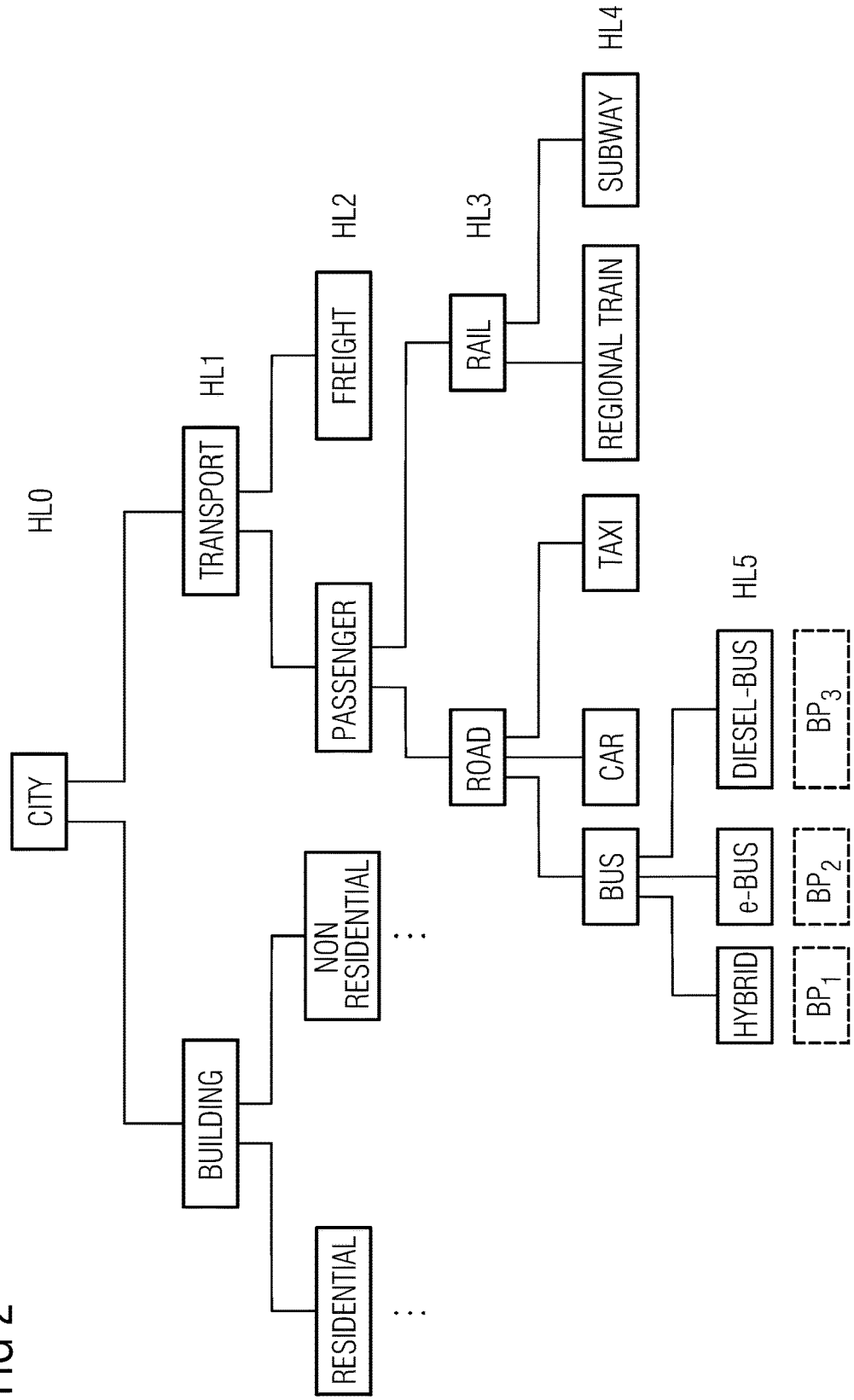
FIG. 2 shows an exemplary hierarchical area data model of an urban area as employed by a system and method of one or more of the present embodiments.

The content management system 3 is separated from the backend system 2 by a second firewall 6. The backend system 2 includes a calculation unit 2A that has access to a database 2B of the backend system 2. The calculation unit 2A is adapted to load area specific content data of a selected urban area from the database 2B. The calculation unit 2A may calculate infrastructure impacts on the selected urban area depending on the loaded area specific content data and technology parameters of predefined infrastructure levers (e.g., options). Area specific content data stored in the database 2 may include hierarchical area data models for one or several urban areas. An example for such a hierarchical area data model is illustrated in FIG. 2. Backend user $U_B$ having the necessary expertise and programming skill has access to the calculation unit 2A, as illustrated in FIG. 1. The calculation unit 2A may run, in a possible embodiment, a multi-user server/client software implemented on a server. In the embodiment shown in FIG. 1, the calculation unit 2A of the backend system 2 does not have a direct connection to the content management system 3. The parameters and result reports generated by the software executed on the calculation unit 2A are, for example, exported Excel data sheets (xls). The exported Excel data sheets may be converted on a terminal 2C by a backend system user $U_B$ such as an editor or content provider into xml files that may be uploaded in a possible implementation manually via the firewall 6 to the content management system 3. Another backend system user $U_B$ working at terminal 2D may further provide web interface content that may be uploaded to the content management system 3 via the second firewall 6.

The content management system 3 includes a content server 3A having access to a content management database 3B. In a possible implementation the content management system 3 is a web-based content management system including, as a database, a SQL database. The content management database 3B stores data of urban areas and result data precalculated by the calculation unit 2A of the backend system 2. In a possible embodiment, the calculation unit 2A of the backend system 2 may calculate different infrastructure impact scenarios in advance that are stored in the content management database 3B of the content management system 3 to be sent on demand to a registered user $U_F$ of the frontend system 4. As shown in FIG. 1, the frontend system 4 is connected to the content management system 3 via the firewall 5 and may include a plurality of terminal devices 4-1, 4-2 . . . , 4-n of front end users $U_F$. A front end user $U_F$ may be, for example, a city account manager. The terminal devices 4-i may be mobile devices such as laptops or iPads linked to the content management system 3 via the firewall 5. In one embodiment, an application software program is executed by a processing unit of the terminal device 4-i. The frontend users $U_F$ have access to the content management database 3B storing the precalculated results for different infrastructure impacts scenarios after having undergone an authentication and access control process. In a further embodiment, a frontend user $U_F$ successfully registered with the system may download an application software for further use. The frontend user $U_F$ may ask for an update sending his username and, for example, a password to the content management server 3A. The user may download updated content data from the content management system 3. The terminal devices 4-i such as mobile devices of the registered users $U_F$ have access to the content management system 3 to receive precalculated infrastructure impact scenarios for predefined infrastructure levers.

In one embodiment, the predefined infrastructure levers for infrastructure elements of the selected urban area are displayed on a display of the terminal device 4-*i* to the registered user $U_F$. The registered user $U_F$ may select and set displayed infrastructure levers along with a corresponding assigned implementation rate IR of the respective infrastructure lever. Each infrastructure lever set by the user may include an absolute or relative implementation rate IR of the respective infrastructure lever assigned by the user $U_F$. The implementation rate IR may be absolute (e.g., the number of planned public transport lines until a specific target year such as 2025) or relative (e.g., indicating a percentage of buildings receiving additional energy saving installations per year). The implementation rate IR may also indicate a portion or share of an infrastructure measure until a target year (e.g., a 25% target share until the year 2025). The implementation rates IR assigned by the user $U_F$ may refer to a specific point in time such as the year 2025 or to a period of time (e.g., to a period of the next ten years). These absolute or relative implementation rates IR may be assigned by the user $U_F$ in a possible embodiment via a user interface of the terminal device 4-*i*. This user interface may be a graphical user interface GUI displayed to the frontend user $U_F$. The infrastructure levers displayed to the user are predefined, and a combination of infrastructure levers of interest may be chosen by the user $U_F$ from an infrastructure lever list displayed to the user. In a further embodiment, key performing indicators (KPI) are calculated indicating the infrastructure impact of the predefined infrastructure levers set by the user for the selected urban area. Calculated key performance indicators may be displayed to the frontend users $U_F$ on a screen of the terminal device 4-*i*. These infrastructure impacts may include environmental impacts and/or economic impacts on the selected urban area. The environmental impacts may include, for example, Green House Gas emissions, NOX emissions and particulate matter (PM) emissions in the selected urban area.

The predefined infrastructure levers used by the frontend users $U_F$ may include different kind of levers. The infrastructure levers may include, in a possible embodiment, efficiency levers, shift levers and demand levers. In this embodiment, efficiency levers represent technology changes or improvements of existing infrastructure elements. For example, a Diesel bus of a first technology generation consuming 50 l of Diesel for 100 km may be replaced by a new Diesel bus of a new technology generation consuming only 40 l per 100 km.

The infrastructure levers may also include shift levers representing a shift from an infrastructure element implemented in a first technology to an infrastructure element implemented in a second technology. For example, diesel-buses might be replaced by e-buses having an electric motor. A further exemplary shift would be substituting private cars in the urban area at least partially by public busses. This may be achieved, for example, by creating a new bus line within the urban area.

Other types of infrastructure levers are demand levers representing changes in demand for infrastructure elements in the urban area. For example, people living in an urban area may have a current transport demand of 5000 km per year, where the transport demand is reduced to 4000 km per person a year within the urban area by a demand lever. For example, by increasing the possibility of people to work at home (e.g., at a home office) by improving the communication facilities in the urban area, the number of commuters within the urban area may be reduced, thereby reducing the demand for person transportation facilities. A further exemplary demand reduction would be achieved by a parking management system avoiding distance traveled to find a parking space.

Another type of infrastructure levers is a combination of efficiency, shift and/or demand levers. For example, for car sharing systems, the efficiency of the car is increased using the latest technology and even electrical cars, and a certain demand has been shifted from individual car trips to public transportation. Another example of the lever using a combination is bus prioritization. Bus signal priority is an attempt to minimize or eliminate delays to buses at a signalized intersection by temporarily altering the traffic signal phase so that an approaching bus receives a green phase when the bus arrives. Avoiding stop and go of buses does reduce the energy demand of the bus per km, providing a more efficient travel. Additionally, the attractiveness of bus travel is increased, resulting in a shift from individual traffic to the public bus transportation mode.

The application program downloaded by the frontend users $U_F$ may be run by a processing device (e.g., a computer processor) of the terminal devices 4-I adapted to work offline from the content management system 3. The application program may use precalculated results to demonstrate the opportunities of influencing the key performance indicators of the urban area by levers. The user may select any combination of levers and implementation rates and compare the impact of these scenarios on the frontend. A content update may be performed on demand of the frontend user $U_F$ who connects to the content management system 3 to download updated content data.

Figure 4:
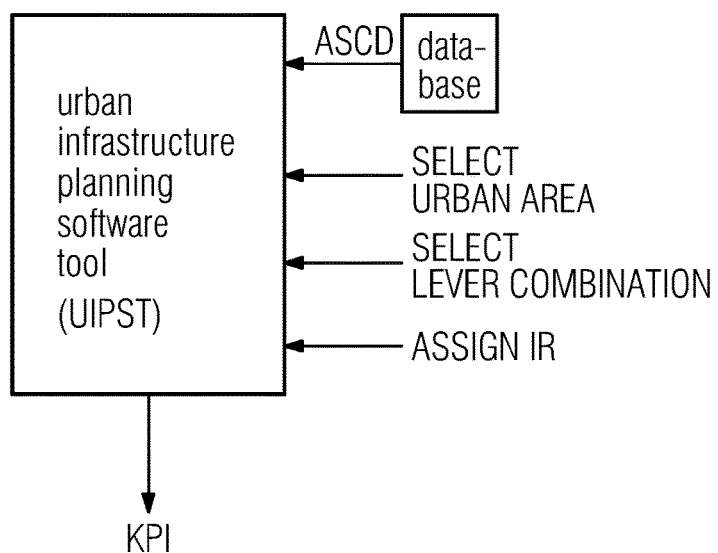
FIG. 4 shows one embodiment of an urban infrastructure planning software tool.

The calculation unit 2A of the backend system 2 may precalculate a number of infrastructure choices. These infrastructure choices or infrastructure impact scenarios are transferred to the content management system 3 and stored in the content management database 3B. The precalculated infrastructure impact scenarios may then be transferred to the mobile application of the frontend system 4. The mobile application running on the terminal device 4-*i* allows an interaction to select several solutions of interest and to visualize the infrastructure impacts on a display of the terminal device 4-*i*. The urban infrastructure planning software tool (UIPST) according to one or more of the present embodiments, as illustrated in FIG. 4, may calculate a plurality of possible solutions and corresponding urban area specific infrastructure impacts based on the specific urban content data and technology parameters.

FIG. 2 shows a diagram for illustrating a possible exemplary implementation of a hierarchical area data model of an urban area such as a city. FIG. 2 shows a general urban area model with different hierarchy levels HL. The shown area model is simplified for illustration purposes. The general urban area model, as illustrated in FIG. 2, may be instantiated for different urban areas or cities and/or for different points in time. For example, the shown general urban area data model may be instantiated for the city of London or the city of Singapore, for example, or any other urban area where sufficient data is available. Further, the general urban area data model, as illustrated in FIG. 2, may be instantiated for different points in time (e.g., for different years such as 2013 or 2025 or 2050). As shown in FIG. 2, the hierarchical area data model includes interlinked processes of infrastructure elements. These processes relate to infrastructure elements of the urban area. In one embodiment, the infrastructure elements of the hierarchical area data model may include building infrastructure elements, transport infrastructure elements and energy infrastructure elements. In the shown simple hierarchical area data model illustrated in FIG. 2, the urban area includes building infrastructure elements and transport infrastructure elements. Buildings may include different categories such as residential or non-residential buildings. Other possible building infrastructure elements may be, for example, hospitals or universities. The transport infrastructure of the city does, for example, include passenger transports and freight transports. Passenger transports may include road transport and rail transport of passengers. The road transport infrastructure elements may include bus transports, car transports or taxi transports of passengers. The busses of the urban area may be implemented in different technologies including hybrid busses, e-busses or Diesel busses. The transport infrastructure of the city may include regional trains and a subway system of the city. As shown in FIG. 2, the hierarchical data area model includes a plurality of hierarchy levels $HL_i$ reaching from a highest hierarchy level HL0 to a lowest hierarchy level HL5. The top hierarchical level HL0 is formed by the urban area (e.g., a city). A lowest hierarchy level such as hierarchy level HL5 is formed by infrastructure elements that may be implemented in different technologies. Each infrastructure element of the hierarchical area data model is represented by corresponding process. Some of the processes of the hierarchical area data model are adapted to interact with pre-defined infrastructure levers set by the user of the system. For example, the process "subway" may interact in an exemplary embodiment with an automatic train operation (ATO) lever. The hierarchical area data model may also include basic processes (BP) beneath the lowest hierarchical level (e.g., hierarchical level HL5) that are adapted to calculate an infrastructure impact of a resource consumption of an infrastructure element at the lowest hierarchical level such as hierarchical level HL5. For example, the process "Diesel bus" of the lowest hierarchical level HL 5 is associated to the basic process BP3 provided to calculate an infrastructure impact of a resource consumption of the infrastructure element "Diesel bus". In one exemplary implementation, this is calculated by use of impact factors (IF). The impact factors IF may, for example, indicate the amount of greenhouse gas emissions for each liter Diesel consumed by a Diesel bus. Another basic process BP2 may be associated to the calculation process of the infrastructure element e-bus, as illustrated in FIG. 2. This basic process BP2 may be used to calculate the output of green house gas emission for each kilowatt of electric energy consumed by an e-bus driven by an electric motor. The basic processes BP are adapted to translate a resource consumption of an infrastructure element implemented in a specific technology to an infrastructure impact using impact factors or impact functions. The infrastructure impact may, for example, include environmental impacts such as Green house gas emissions or NOX emissions or particulate matter (PM) emissions, but also economic impacts such as jobs created when using the respective technology. For each process of the hierarchical area data model, as illustrated in FIG. 2, a current and/or future implementation rate IR may be assigned by a user. The current implementation rate IR indicates the implementation rate or implementation share of the respective infrastructure element at the current point of time (e.g., the year 2013), whereas the future implementation rate does indicate an implementation rate of the respective infrastructure element in the future such as in the year 2050. For example, current implementation rates for the infrastructure elements hybrid bus, e-bus and Diesel bus may be, for example, 5%, 5% and 90%, respectively, which provides that 90% of the busses of the city are implemented in the technology "Diesel bus", but only 5% of the busses are implemented in the technology "e-bus" or "hybrid bus". The user of the system may change the implementation rate (IR) to get a forecast of the impact of such an infrastructure measure. For example, the portion of busses implemented in different technologies may be changed by assigning future implementation rates for a target year such as the year 2025. The user may set the implementation rates (IR), for example, to 10% for hybrid busses, 10% for e-busses, resulting in a replacement of diesel busses for the year 2025. The user may evaluate the environmental impacts that this measure would have on the greenhouse gas emissions in the urban area.

In the given example of the hierarchical area data model illustrated in FIG. 2, the area specific content data may indicate a current situation in an urban area such as London. From a statistical report stored in a database or by input data, the urban area model of the city of London may indicate that the city of London includes ten million people that are to be transported as passengers. The transport demand of an average passenger in the urban area of London may be, for example, 5000 km per year so that the general transport demand of passengers is $5 \times 10^{10}$ km in the urban area of London. The demand may be satisfied, for example, by road passenger transports or by rail passenger transports. For example, 50% of the passengers in London may be transported by road transport facilities, where the remaining 50% are transported by rail transport facilities. Accordingly, the current transport demand transporting passengers by road within the urban area is in this example $0.5 \times 5 \times 10^{10}$ km per year=$2.5 \times 10^{10}$ km per year. For example, 60% of the passengers transported by road facilities may be transported by bus equivalent to $0.6 \times 2.5 \times 10^{10}$ km per year=$1.5 \times 10^{10}$ km per year. In the current situation of the year 2013, 90% of the city busses are implemented in the technology "Diesel bus", leading to a demand of $1.35 \times 10^{10}$ km per year.

The user of the system may use different levers to investigate possible infrastructure impacts such as environmental impacts. These levers may include efficiency levers, shift levers or demand levers. A possible exemplary infrastructure measure would be to replace all Diesel busses of the current bus fleet by e-busses. As it is known how many liters one Diesel bus does consume per 100 km (e.g., 50 liters per 100 km), a resource consumption of the resource Diesel per year may be calculated. Further, using an impact factor IF, a corresponding environmental impact such as greenhouse gas emissions caused by the Diesel busses may be calculated as well.

When replacing the Diesel busses by e-busses, how many kilowatts the new e-busses will consume for transporting the same number of passengers in the urban area may be calculated. By using a corresponding basic process BP2, this may be translated in corresponding greenhouse gas emissions in the urban area caused by the e-busses. The infrastructure impact when replacing Diesel busses completely by e-busses within the urban area may be compared. For example, the system may output the saved amount of greenhouse gas (e.g., in tons) caused by the system structure measure of replacing Diesel busses in the city completely by e-busses.

Figure 3:
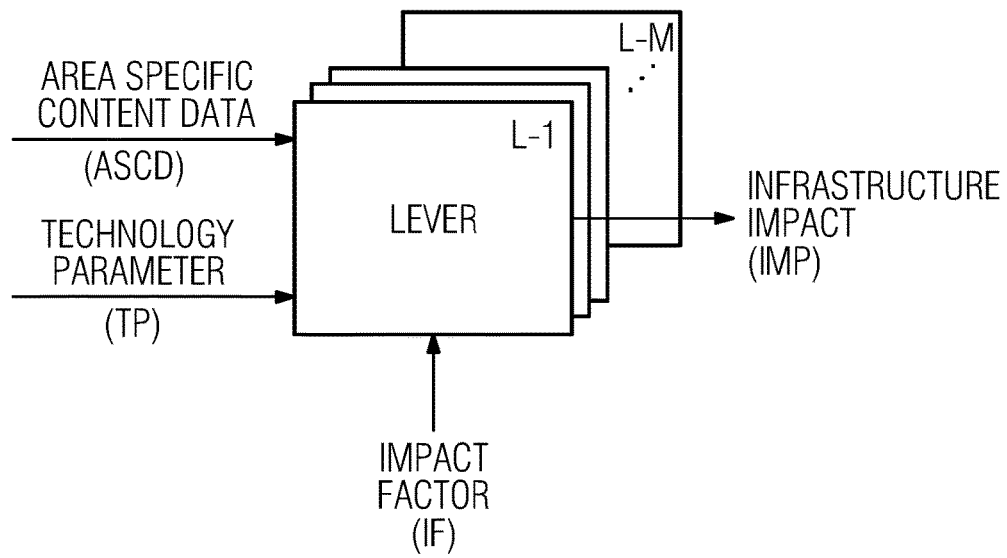
FIG. 3 shows exemplary operation of an infrastructure lever.

FIG. 3 shows a diagram for illustrating the use of pre-defined levers to calculate one or a plurality of infrastructure impacts on the urban area. In the shown example, the user may use up to M predefined levers and a combination to calculate infrastructure impacts on the urban area. The predefined levers are linked to processes of the hierarchical area data model of the urban area, as shown in FIG. 2. Each lever L-i may influence one or several processes of the hierarchical area data model. Each process may have a plurality of levers. Further, each lever L-i is adapted to calculate an infrastructure impact based on the area specific content data (ASCD) and one or more technology parameters TP. In one embodiment, the area data model may include as infrastructure elements, building infrastructure elements, transport infrastructure elements and energy infrastructure elements. For each group of infrastructure elements, several different predefined infrastructure levers may be presented to a user by displaying the different predefined infrastructure levers on a screen of the terminal device 4-1.

Figure 9:
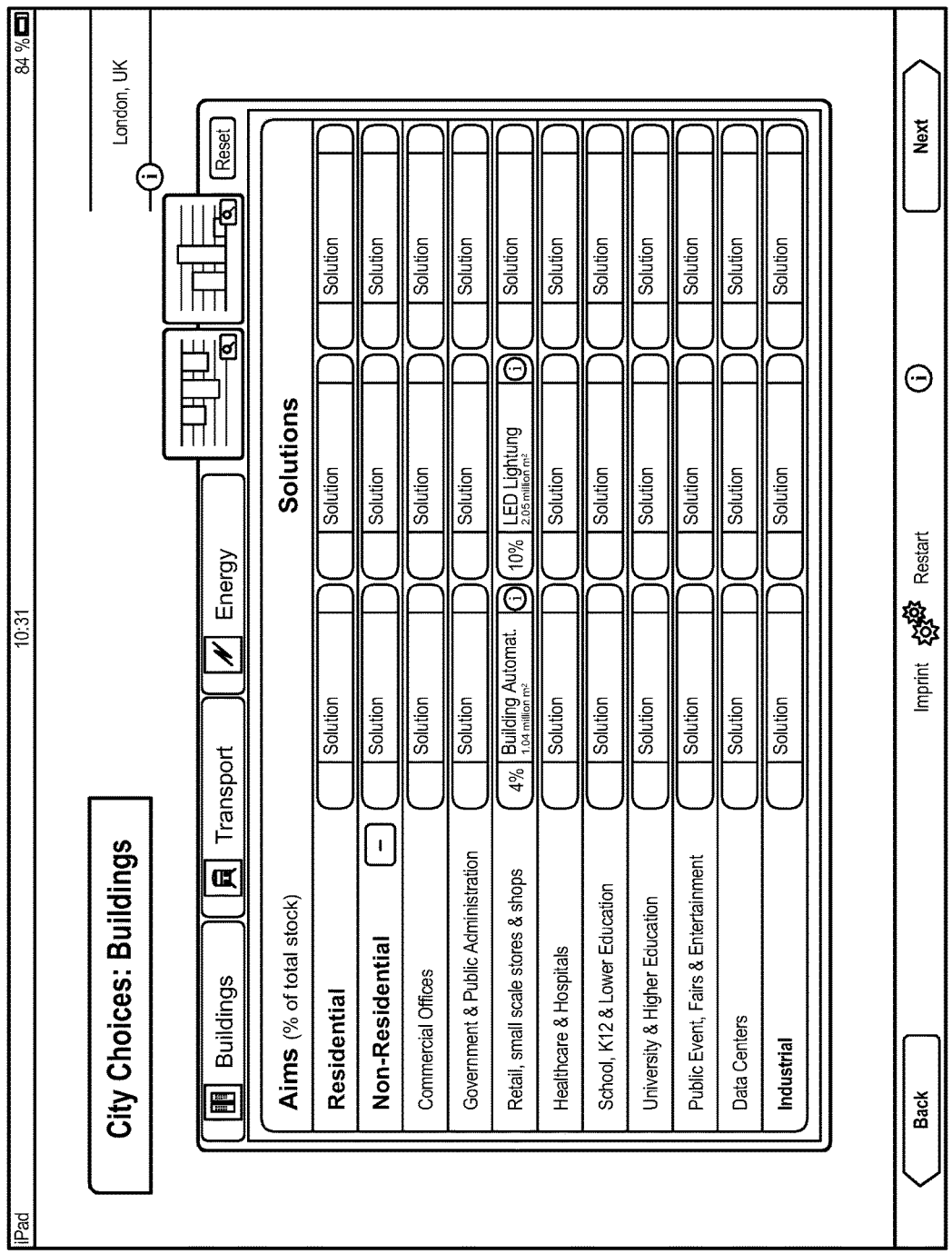
FIG. 9 shows a screenshot of an exemplary software tool to illustrate the operation of setting the levers and implementation rates.

FIG. 9 shows a screenshot of an exemplary urban planning software tool illustrated in FIG. 4, which embodies a method for providing infrastructure impacts on an urban area. In the shown example, a list of infrastructure elements of the hierarchical area data model is displayed to the user. The list of infrastructure elements includes, for example, non residential building elements of the city including commercial offices, government and public administration, retail, small scale stores and shops, healthcare and hospitals, schools, university and higher education, public event fairs and entertainment, as well as data centers. For each infrastructure element of the model, the frontend user $U_F$ may select between different levers and assign a corresponding implementation rate IR. For example, the user may set the predefined infrastructure lever "Building Automation" with an implementation rate of 4%. The lever "Building Automation" relates to an automatic adjustment of heating, cooling, ventilation and lighting depending on the environmental conditions and the room occupancy by applying sensors and actuators, as well as control units. This reduces the energy demand of heating, cooling, ventilation and lighting.

A further example for predefined levers applied to buildings may be, for example, the predefined lever "Wall insulation" relates to a solid wall insulation that may be applied to already constructed buildings of the urban area. Insulation reduces the heat losses through the walls of the building. The impact of this lever is a reduction of heating/cooling demand and a reduction of heat losses/gain through walls by reducing a terminal transfer coefficient. The number of predefined levers that may be set by a user for an urban area may vary.

Figure 5:
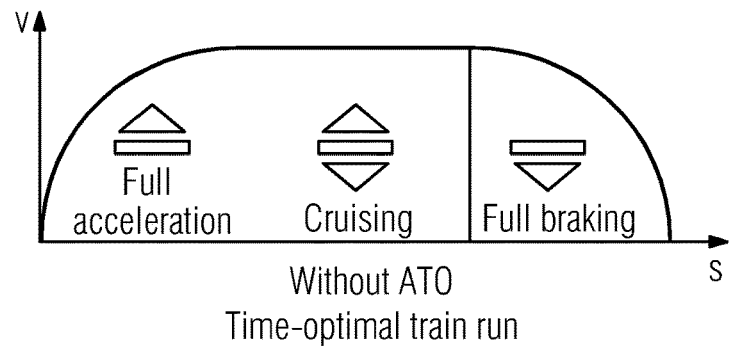
FIGS. 5-8 illustrate function of an exemplary infrastructure lever.
Figure 6:
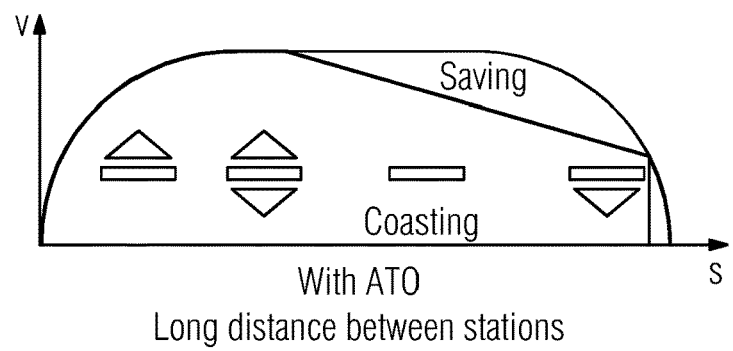
Figure 7:
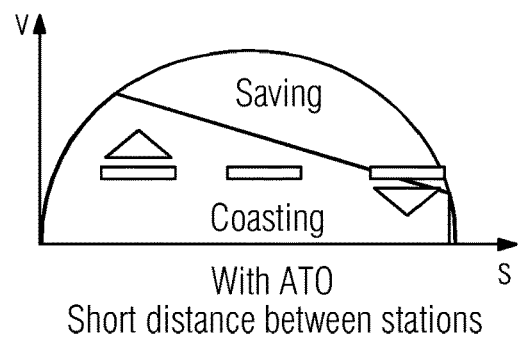

Another example for a predefined lever in the transport domain is the lever "Automated Train Operation (ATO)" for the infrastructure element "subway" in the urban area data model, as illustrated in FIG. 2. The automated train operation (ATO) controls or guides optimal throttle of engines going at a minimum speed without violating a time schedule. This reduces the electricity consumed per person km due to coasting. ATO may take either total control over a train (e.g., a driverless system) or may give advice to the driver of the train to throttle the engines of the train. Technological impacts of this lever are energy savings for person kilometres (pkm) resulting in GHG, NOX and PM savings. An interaction of this lever with the area data model is that the energy efficiency of the ATO depends on distances S between the train stations. In one embodiment, the ATO lever may be described as a function, as illustrated in FIGS. 5, 6, 7 and 8. FIGS. 5, 6, 7 show a speed or velocity (v) profile over a distance S for a train. FIG. 5 shows the situation without an ATO system for a time optimal train run. The train is first fully accelerated and then starts to cruise before full breaking is activated. FIG. 6 shows a situation of a train with an implemented ATO system with a large distance between two train stations. FIG. 7 shows a situation for a train driving from a first train station to a second train station, where both train stations are located close to each other (e.g., where the distance S between the train stations is short).

Figure 8:
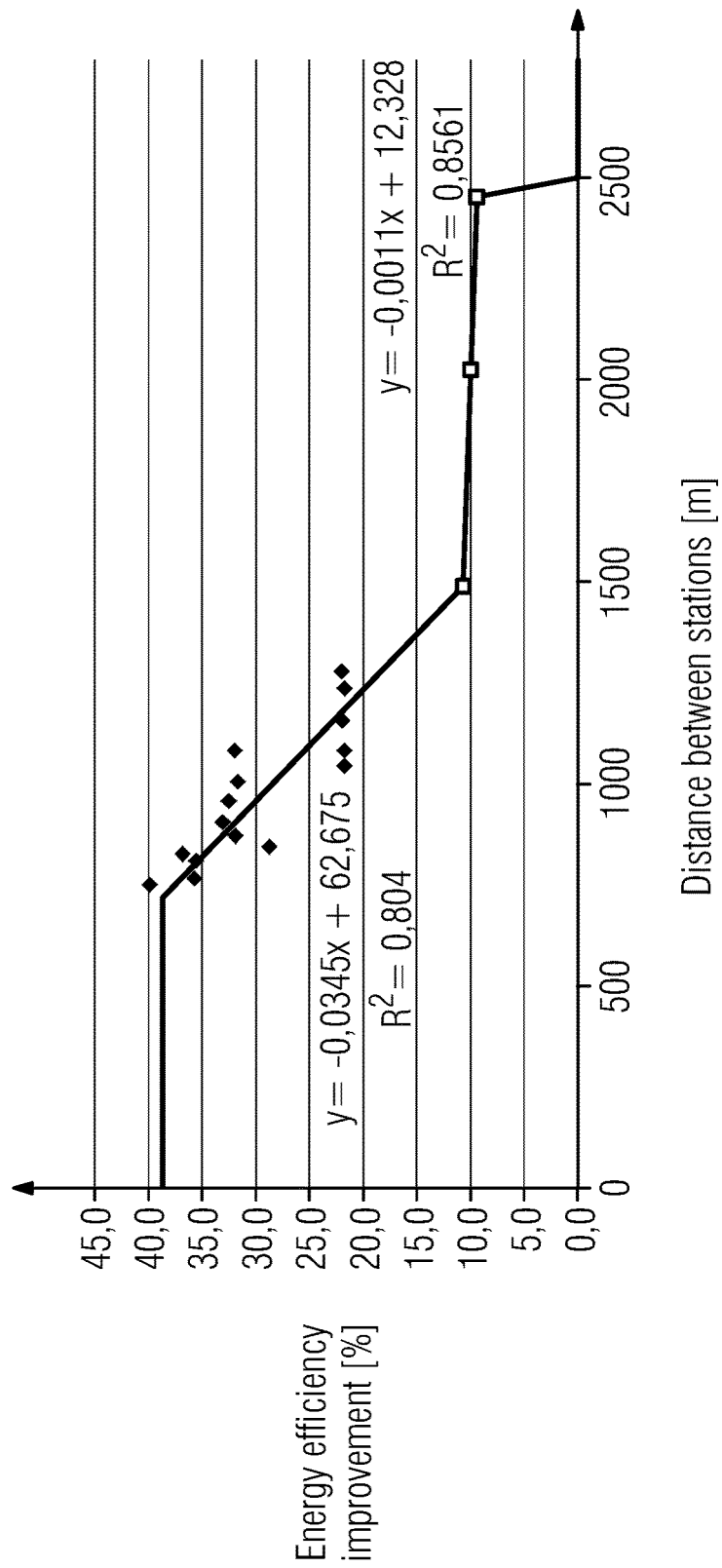

FIG. 8 shows a diagram illustrating an energy efficiency function that may be derived from simulations and may be used to calculate an infrastructure impact. The function shown in FIG. 8 shows an energy efficiency improvement or energy reduction in percent depending on a distance S between train stations in meters [m]. The function shows that with increased distance between the train stations, the energy reduction or energy efficiency improvement achieved by ATO is diminished.

In one embodiment, specific parameters are collected to calculate the impact of the predefined lever ATO including a total length of a subway system of the urban area, the number of subway stations within the urban area and the current share of trains equipped with an ATO system.

In the hierarchical area data model shown in FIG. 2, the ATO may be linked to the process "subway". A process "subway" may include a lever, as illustrated in FIG. 3, where the area specific content data (ASCD) is, for example, 500 million kilometre subway travel demand within the urban area per year. The number of people living in the city and the corresponding yearly demand for transport facilities (e.g., for using the subway system) may be calculated based on the hierarchical area data model, for example. Further, the lever may get the information data that a train consumes 0.2 kWh/km electricity as a technology parameter TP. By using a basic process, the consumed electricity may be translated into environmental impacts by impact factors IF. Such an impact factor IF may indicate, for example, that 1 kWh electricity is equivalent to 0.5 kg CO2e. For this data, the lever may calculate that the infrastructure impact is that the greenhouse gas emissions in this urban area are 50 ktons CO2e per year based on a predefined lever function.

The ATO lever may use further input data from the hiercharical area data model. For example, for an urban area such as London, additional parameters and functions may be used to calculate infrastructure impacts. For example, the urban area model may indicate that the total length of the subway net grid in kilometres is 400 km, and the number of train stations is 200. The urban area model may further indicate currently no subway lines with automated train operation ATO exist in the city. In this example, an average distance between train stations may be calculated to be 400 km:200=2 km. From the energy efficiency function implemented in the ATO lever, such as illustrated in FIG. 8, it may be calculated that the corresponding energy reduction with an ATO system would be 10%. A technology parameter TP indicates that 0.2 kWh/km electricity is to be provided. By reducing the consumed energy by 10%, the energy to be provided is only 0.18 kWh/km Since the impact factor is 0.5 kg CO2e emission per 1 kWh, the environmental impact equates to 45 ktons CO2e emission per year. Different demands in million kilometer subway travel results in a different impact, however, with the same energy reduction per kilometre. The same demand but with a different subway grid having different average distances between train stations results in a different energy reduction and a different environmental impact. For example, if the number of train stations is increased from 200 to 300, the average distance between train stations is reduced. The reduced distance between train stations leads to an increase of energy efficiency.

Further, if there is the same travel demand for the subway grid, and the number of train stations is kept constant, but the number of subway lines is different, the environmental impact may be similar. However, economical impacts such as costs and jobs created may be different.

Figure 10:
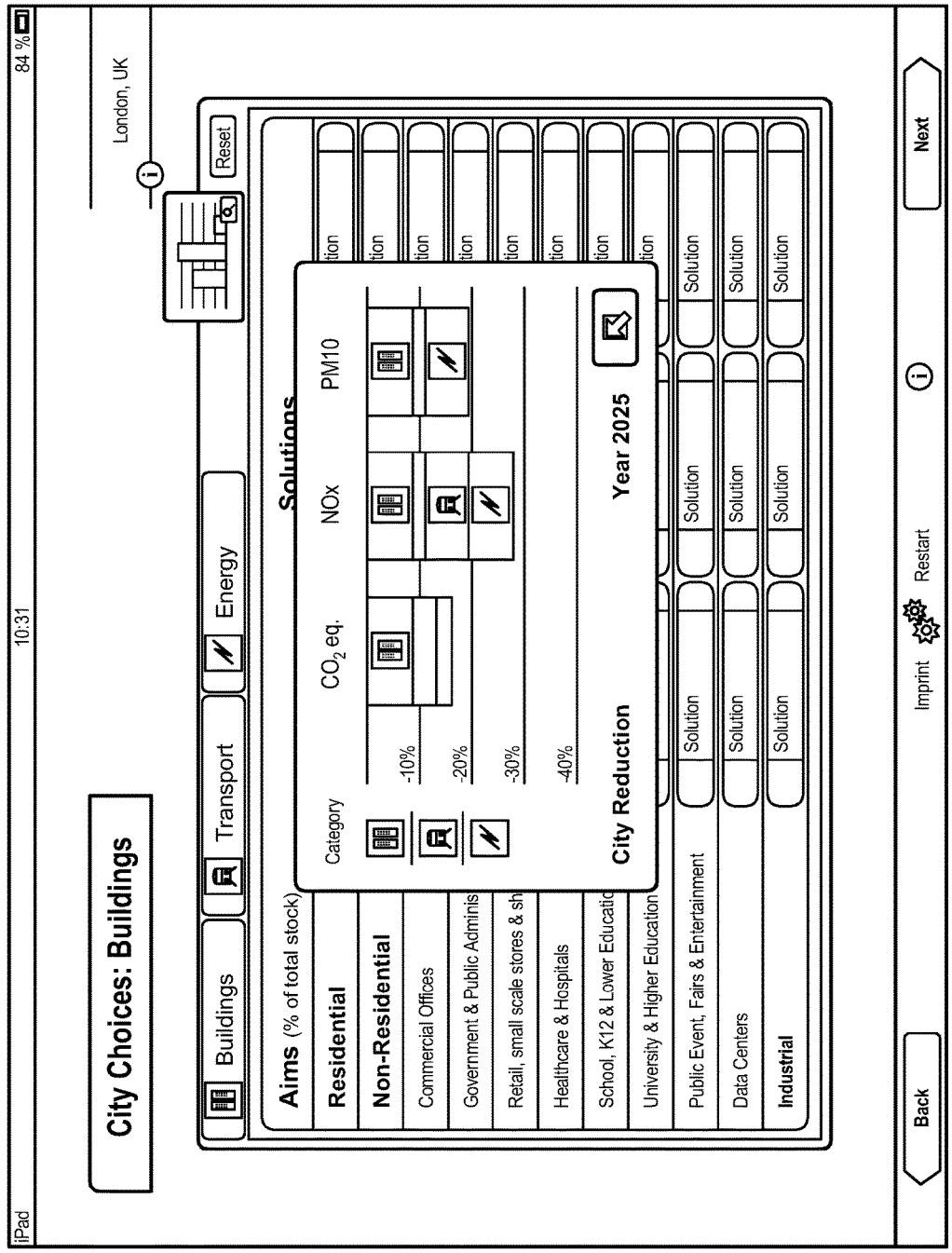
FIGS. 10-12 show exemplary screenshots of an urban planning software tool to illustrate possible outputs to a user.
Figure 11:
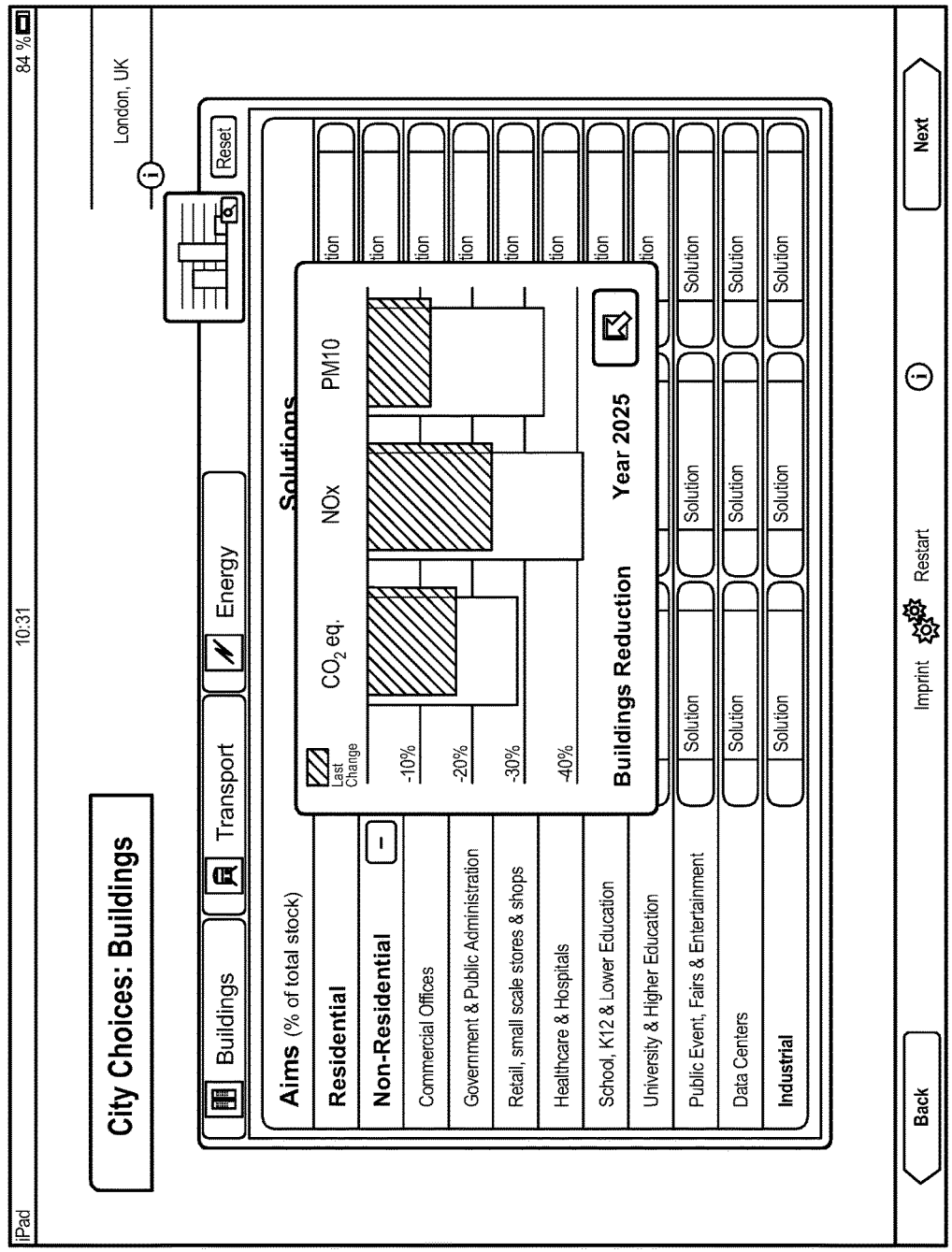
Figure 12:
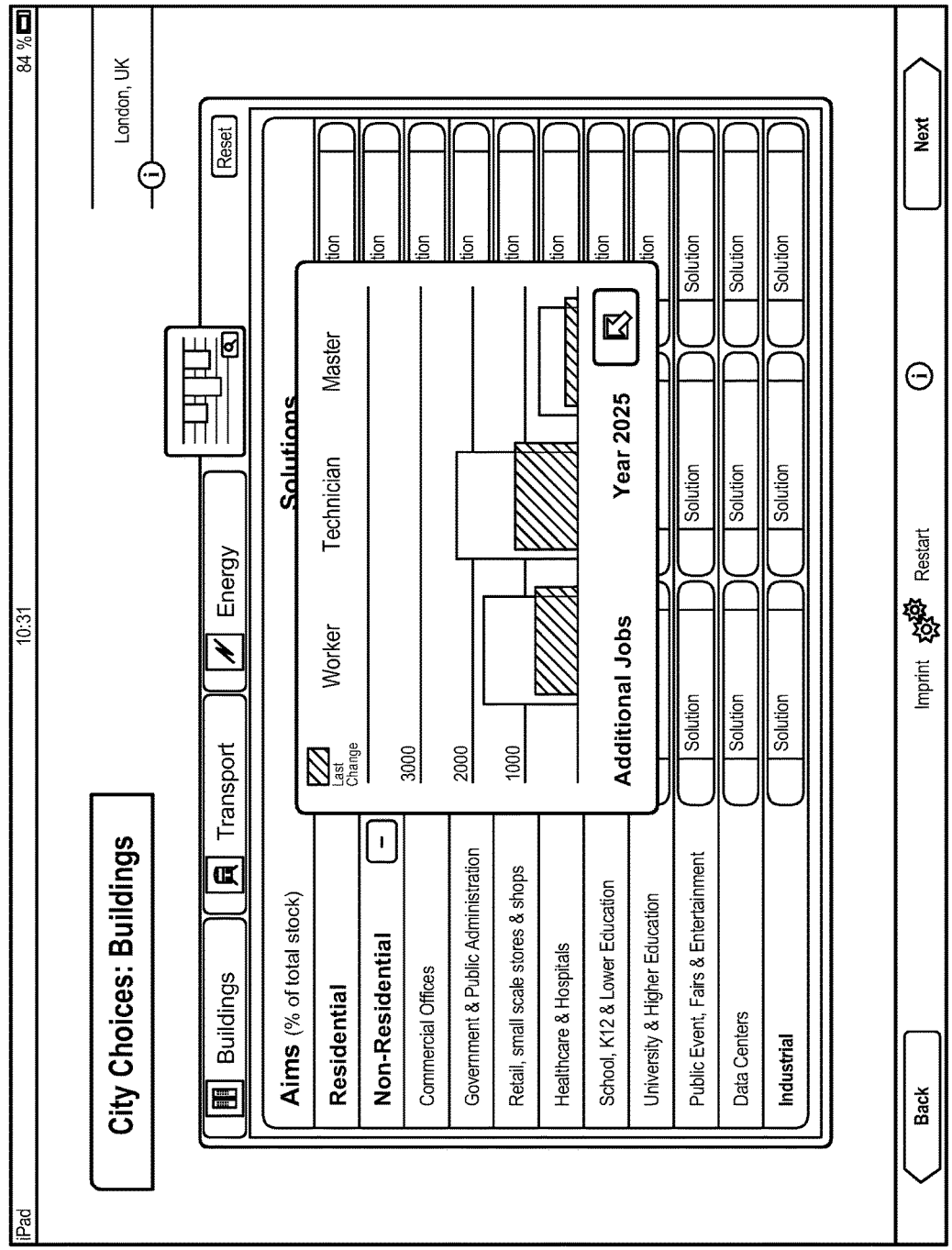

FIGS. 10, 11, and 12 show screenshots of one embodiment of an urban planning software tool illustrating a direct impact analysis of the urban area for the year 2025. FIGS. 10, 11 illustrate environmental impacts of emissions such as CO2e, NOX for PM10 on the urban area and on the building infrastructure of this urban area. FIG. 12 illustrates exemplary economical impacts (e.g., job created) for different groups such as worker, technicians or masters.

Figure 13:
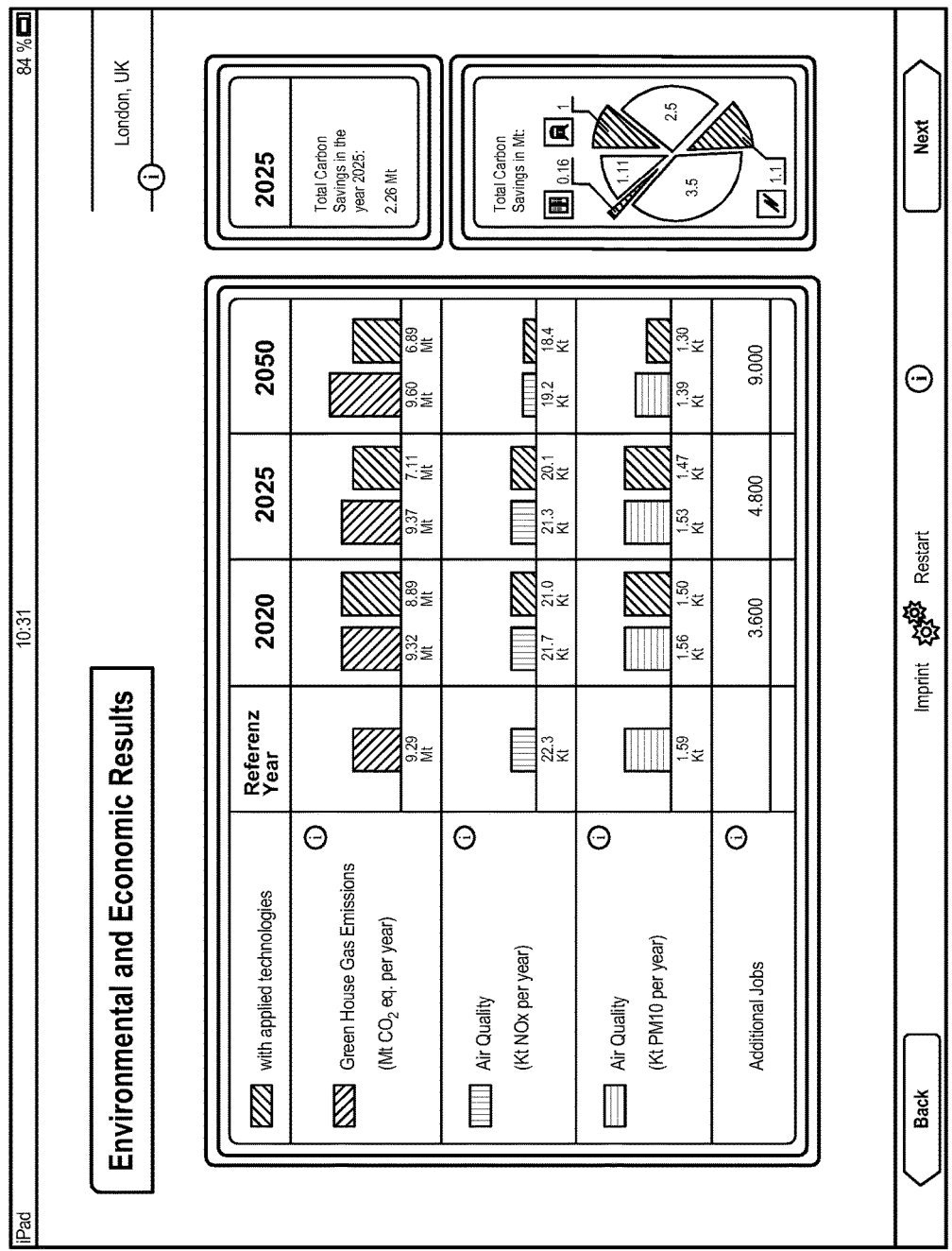
FIGS. 13 and 14 show further screenshots of the exemplary urban planning software tool to illustrate possible outputs to a user.
Figure 14:
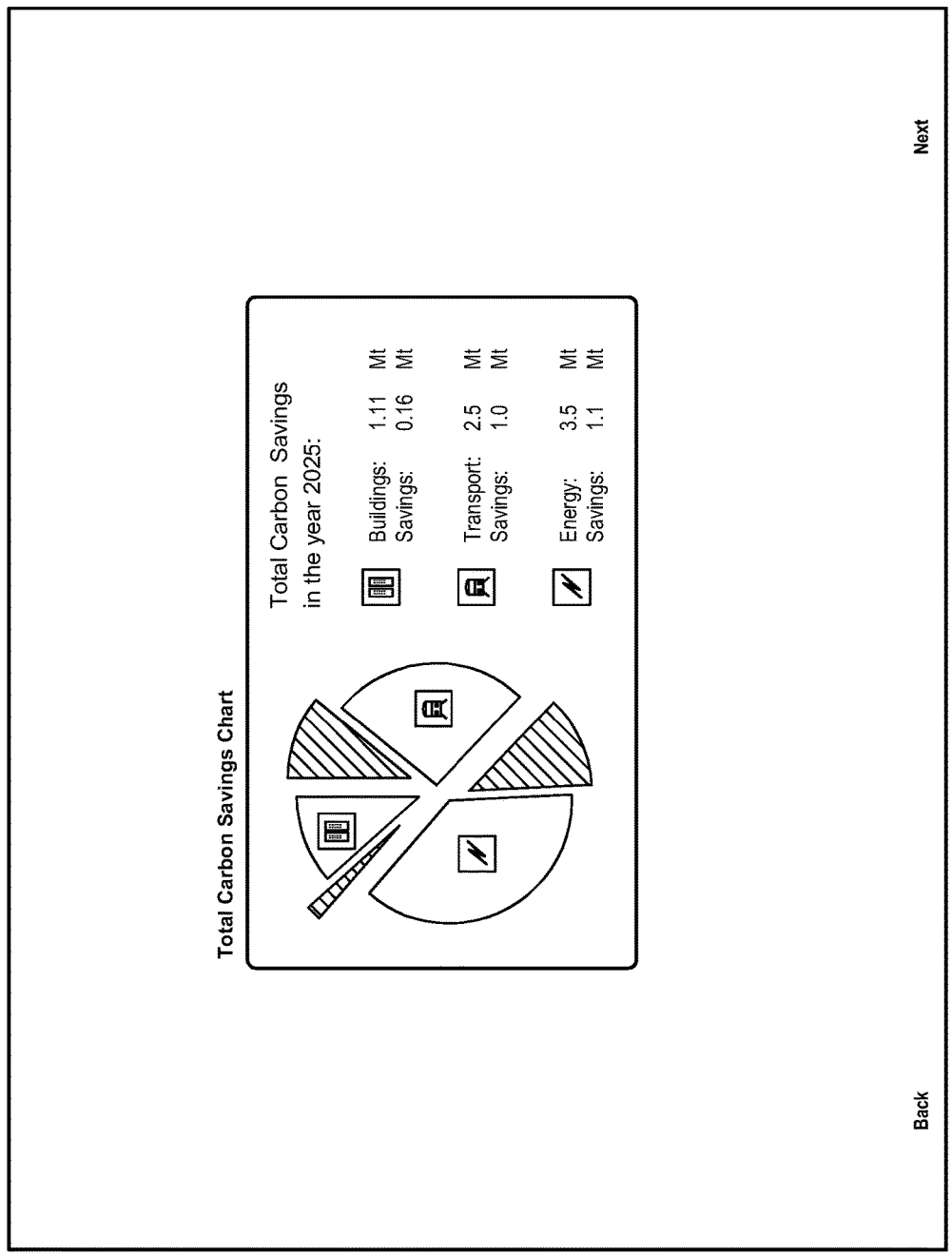

FIGS. 13, 14 show further screenshots of one embodiment of the urban planning software tool. FIG. 13 shows exemplary result tables for environmental impacts such as greenhouse gases and air quality for different reference years 2020, 2025 and 2050. FIG. 14 shows a pie chart of exemplary total carbon savings achieved by infrastructure measures.

FIG. 15 shows a further screenshot of one embodiment of the urban planning software tool showing three top levers for each vertical of the urban area and corresponding impacts after an environmental analysis has been performed. The shown tool box provides a comparison with equivalents to greenhouse gas savings. Results may be converted to specific equivalents. In the given example, the applied levers provide a saving of 2.26 million tons of CO2e translated in the given example to carbon sequestered by over 25 million tree seedlings. By this feature, the abstract environmental impact of 2.26 million tons of CO2e is better understandable for a decision maker or stakeholder deciding on infrastructure measures.

The method and system according to one or more of the present embodiments provides a city specific evaluation of infrastructure and technology impacts. The system has the advantage that the system allows a fast comparison of different scenarios by using precalculated results loaded from the content management system 3. The presented results are easy to understand for stakeholders or project planners with no or little technical background. This leads to better decisions in an early planning stage or planning phase of an infrastructure project in an urban area. By using a hierarchical area data model, it is possible to navigate easily within the model having corresponding predefined levers presented to the user on a screen. The user has an easy overview on the screen due to the limited number of show case categories. Additional levers may be integrated into the system depending on the project. The method and system provide a comprehensive view on the technical and economical impacts and may calculate corresponding target or key performing indicators (KPI). The infrastructure impacts may be presented to the user at different levels of detail. The calculations may be done case by case or in combination to every urban area to be analyzed and to every technical solution to be analyzed. The system provides a procedure and a tool for infrastructure decisions and may calculate a bunch of possible alternative technical solutions or implementations and corresponding city specific impacts based on the city data and technology parameters. The method and system provide a compelling tool for lead management in an urban area. The method and system combine technology expertise and urban development expertise to calculate and visualize cumulative environmental and/or economical impacts or benefits on a city level. Each applied lever may be programmed or implemented individually in the backend system 2. The hierarchical urban area data model, as illustrated, as well as the lever data models may be adjusted by a backend user or expert of the backend system 2. The urban area data model may represent the infrastructure of any urban area in a reproducible manner and to a suitable level of detail to configure the lever function to the specific situation of the urban area accurately. The urban area data model may be easily enlarged if additional specific data becomes available.

When a new project in a city is planned, city specific data is loaded from databases or input by backend users. The calculated results may be transferred to the content management system 3. The frontend system 4 has access to the content management system 3. The frontend user UF may select a desired city and perform an infrastructure analysis using the urban infrastructure planning software tool, which may be done online or offline. The method and system according to one or more of the present embodiments may be applied in a flexible manner to any urban area (e.g., to big or mega cities). The system may be implemented as a distributed system. The method and system are easy to understand for non-technical decision makers or stakeholders and allow an easy and fast combination of different levers. The method and system allow an immediate analysis for different scenarios. The model and lever functions allow a scalability for specific city situations. The method and system operate with urban area specific data and/or default values. The method and system may be used in an early planning stage. Technology impacts may be demonstrated with a reasonable level of accuracy. The method and system combine a bottom up and top down approach (e.g., a job creation top down sector specific information on investment, job created per million dollar investment or bottom up using a reference project experience). The method and system may operate offline or online, thus increasing the flexibility of interaction.

The number of available program levers may vary. Levers may take into account different infrastructure measures to be performed. Examples for levers would be, for example, "new bus services" (e.g., the provision of additional bus services or bus lines with increased bus capacity or an increased bus frequency). This reduces the energy demand per person kilometre compared to individual passenger transport.

Another example for a lever in the transportation domain is a "bus rapid transit" (e.g., a public transportation system using busses to provide faster, more efficient services than a conventional bus line by improving infrastructure, priority lines, vehicles and scheduling). This has the technical impact of reducing fuel consumption per person kilometre due to higher travel speed and reduced travel time.

A further example for a predefined lever in the transportation domain are "E-highways" that provide a continuous external electrical power for heavy duty trucks. An impact of this lever is that hybrid Diesel electric trucks are far more efficient than standard Diesel trucks.

A further possible lever in the transport domain is the use of intelligent street lighting, reducing the energy demand by demand oriented regulation. Another possible predefined lever is the lever "parking management", which refers to policies and programs that result in a more efficient use of parking resources within an urban area. The impact of this lever is the reduction of trip distances for searching parking lots and the reduction of the number of parking spaces provided in an urban area.

An example for a lever that may be used in the energy domain is the "Integration of renewal energy generation", which reduces the demand from the electrical grid or delivered to the electrical grid. This may lead to a reduced emission factor by switching from conventional to renewable energy sources such as wind, solar, bionics, geothermal or thermal energy sources.

From the above given examples, it is shown that there is a high variety of possible predefined levers that may be set by users to analyze infrastructure impacts on an urban area.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A system for providing infrastructure impacts on an urban area, the system comprising:
   a terminal device comprising a display, wherein the display comprises a graphical user interface having predefined infrastructure levers configured to be set by a user via the graphical user interface; and
   at least one processor configured to:
      load area specific content data of a selected urban area from a database, wherein the area specific content data of the selected urban area comprises a hierarchical area data model of the selected urban area for at least one point in time including interlinked processes of infrastructure elements, and wherein at least some processes of the hierarchical area data model interact with predefined infrastructure levers;
      receive technology parameters and implementation rates when the predefined infrastructure levers are set by the user via the graphical user interface; and
      calculate infrastructure impacts for the selected urban area based on the loaded area specific content data and the technology parameters and implementation rates from the predefined infrastructure levers; and
   wherein the graphical user interface of the terminal device displays the infrastructure impacts for the selected urban area, and
   wherein the system provides for improved decision-making in planning of an infrastructure project in the selected urban area by providing fast comparisons of different infrastructure impacts on the graphical user interface of the terminal device.

2. The system of claim 1, further comprising:
   a backend system, the backend system comprising a calculation unit configured to precalculate infrastructure impact scenarios; and
   a content management system comprising a content management database, the content management database configured to store the precalculated infrastructure impact scenarios.

3. The system of claim 2, wherein terminal devices of registered users have access to the content management system to receive precalculated infrastructure impact scenarios for predefined infrastructure levers.

4. The system of claim 3, wherein predefined infrastructure levers for infrastructure elements are displayable on the display along with the corresponding assigned implementation rate of the infrastructure lever.

5. The system of claim 1, wherein the implementation rate is an absolute or relative implementation rate of an infrastructure lever that is assignable by the user to each infrastructure lever set by the user.

6. The system of claim 1, wherein basic processes of the hierarchical area data model are adapted to calculate an infrastructure impact of a resource consumption of an infrastructure element of a process at a lowest hierarchical level of the hierarchical area data model.

7. The system of claim 1, wherein key performance indicators indicating the infrastructure impact of the predefined infrastructure levers set by the user on the selected urban area are calculatable.

8. The system of claim 1, wherein the infrastructure impacts comprise environmental impacts, economic impacts, or the environmental impacts and the economic impacts on the selected urban area.

9. The system of claim 8, wherein the environmental impacts comprise greenhouse gas emissions, NOX emissions, particulate matter emissions, or a combination thereof in the selected urban area.

10. The system of claim 1, wherein the infrastructure elements of the hierarchical area data model of the selected urban area comprise building infrastructure elements, transport infrastructure elements, energy infrastructure elements, or a combination thereof of the selected urban area.

11. The system of claim 1, wherein the predefined infrastructure levers comprise:
   efficiency levers representing technical improvements of an implemented technology of an infrastructure element;
   shift levers representing a shift from an infrastructure element implemented in a first technology to an infrastructure element implemented in a second technology;
   demand levers representing changes in demand for infrastructure elements in the urban area, and
   levers combining at least two of efficiency improvement, shifting the infrastructure element, and demand reduction.

12. The system of claim 1, wherein the hierarchical area data model is a parameterized data model used to analyze different urban areas.

13. The system of claim 1, wherein the predefined infrastructure levers comprise improvement functions based on empirical data models, scientific data models, or empirical and scientific data models applied to the infrastructure elements to calculate an individual impact on the urban area.

14. The system of claim 1, wherein the infrastructure impacts for the selected urban area are calculatable for a selectable combination of predefined infrastructure levers.

15. The system of claim 1, wherein the system is a distributed system comprising:
   a backend system providing complete and comprehensive calculation capabilities on a high level of detail; and
   a frontend system adapted to receive precalculated results for predefined levers, and
   wherein a combination of the predefined infrastructure levers of interest is selectable, unselectable, combinable, and changeable by the user.

16. A method for providing infrastructure impacts in an urban area, the method comprising:

loading, by at least one processor, area specific content data of a selected urban area from a database, wherein the area specific content data of the selected urban area comprises a hierarchical area data model of the selected urban area for at least one point in time including interlinked processes of infrastructure elements, and wherein at least some processes of the hierarchical area data model interact with predefined infrastructure levers;

receiving, by the at least one processor, technology parameters and implementation rates of predefined infrastructure levers set by a user via a graphical user interface;

calculating a plurality of different infrastructure impacts for the selected urban area depending on the loaded area specific content data and the technology parameters and implementation rates of the predefined infrastructure levers, wherein the different infrastructure impacts are calculated based on different combinations of infrastructure levers set by the user via the graphical user interface; and displaying or storing the calculated infrastructure impacts for the selected urban area via the graphical user interface, wherein the method provides for improved decision-making in planning of an infrastructure project in the selected urban area by providing fast comparisons of different infrastructure impacts on the graphical user interface of the terminal device.

17. A non-transitory computer-readable storage medium comprising an urban infrastructure planning software tool having instructions executable by a processor to simulate infrastructure impacts on an urban area, the instructions comprising:

loading area specific content data of a selected urban area from a database;

receiving technology parameters and implementation rates of a subset of a plurality of predefined infrastructure levers set by a user via a graphical user interface, wherein the plurality of predefined infrastructure levers comprises: (1) efficiency levers representing technical improvements of an implemented technology of an infrastructure element, (2) shift levers representing a shift from an infrastructure element implemented in a first technology to an infrastructure element implemented in a second technology, (3) demand levers representing changes in demand for infrastructure elements in the urban area, and (4) levers combining at least two of efficiency improvement, shifting the infrastructure element, and demand reduction;

calculating infrastructure impacts on a selected urban area based on the loaded area specific content data and the technology parameters and implementation rates of the subset of the plurality of predefined infrastructure levers; and displaying or storing the calculated infrastructure impacts on the selected urban area via the graphical user interface, wherein the urban infrastructure planning software tool provides for improved decision-making in planning of an infrastructure project in the selected urban area by providing fast comparisons of different infrastructure impacts on the graphical user interface of the terminal device.

18. The non-transitory computer-readable storage medium of claim 17, wherein the instructions further comprise calculating key performance indicators indicating infrastructure impacts of the predefined infrastructure levers set by the user on the selected urban area.

* * * * *